US006125015A

United States Patent [19]

[11] Patent Number: 6,125,015

[45] Date of Patent: Sep. 26, 2000

Carlson et al.

[54] HEAD GIMBAL ASSEMBLY WITH LOW STIFFNESS FLEX CIRCUIT AND ESD PROTECTION

[75] Inventors: Carl J. Carlson, Pleasanton; Viktor S. Doundakov, San Jose, both of Calif.

[73] Assignee: Read-Rite Corporation, Milpitas, Calif.

[21] Appl. No.: 09/205,338

[22] Filed: Dec. 4, 1998

[51] Int. Cl.[7] ........ G11B 5/58

[52] U.S. Cl. ........ 360/245.9

[58] Field of Search ........ 360/103, 104, 360/137, 97.01, 245, 245.8, 245.9; 361/398; 369/126; 29/603.07

[56] References Cited

U.S. PATENT DOCUMENTS

| | | | |
|---|---|---|---|
| 4,645,280 | 2/1987 | Gordon et al. | 339/17 |
| 4,761,699 | 8/1988 | Ainslie et al. | 360/103 |
| 4,800,454 | 1/1989 | Schwarz et al. | 360/103 |
| 4,819,094 | 4/1989 | Oberg | 360/104 |
| 4,996,623 | 2/1991 | Erpelding et al. | 360/104 |
| 5,055,969 | 10/1991 | Putnam | 361/398 |
| 5,124,864 | 6/1992 | Matsuzaki | 360/104 |
| 5,185,683 | 2/1993 | Oberg et al. | 360/104 |
| 5,491,597 | 2/1996 | Benin et al. | 360/104 |
| 5,528,819 | 6/1996 | McKay et al. | 360/103 |
| 5,597,496 | 1/1997 | Masaichi et al. | 216/94 |
| 5,598,307 | 1/1997 | Bennin | 360/104 |
| 5,606,477 | 2/1997 | Erpelding et al. | 360/104 |
| 5,644,454 | 7/1997 | Arya et al. | 360/106 |
| 5,654,850 | 8/1997 | Ganapathi et al. | 360/103 |
| 5,687,479 | 11/1997 | Bennin et al. | 29/885 |
| 5,699,212 | 12/1997 | Erpelding et al. | 360/104 |
| 5,734,523 | 3/1998 | Scheidecker et al. | 360/103 |
| 5,933,293 | 8/1999 | Bennin | 360/104 |

*Primary Examiner*—David L. Ometz
*Assistant Examiner*—Chen Tianjie
*Attorney, Agent, or Firm*—Samuel A. Kassatly

[57] ABSTRACT

A head gimbal assembly includes a suspension of the type supporting a slider and a flex circuit. The suspension is formed of a load beam that supports the flex circuit, and a resilient flexure which is secured to the load beam and which supports the slider. The flex circuit is comprised of conductive traces formed on a compliant, dielectric substrate. The substrate includes a body portion and a head portion for supporting the conductive traces. The substrate head portion is patterned such that selected portions of the head portion are removed to leave bare conductive trace sections, and to achieve reduced pitch and roll stiffness of the flex circuit. The flex circuit can optionally include a thin seed layer formed on the underside of the substrate to reduce static charge buildup.

18 Claims, 12 Drawing Sheets

118
119
111
112
116
115
102
110
70H
113
70B
92F
100
50
70
94F
75
96F

AREA A

HEAD GIMBAL ASSEMBLY WITH LOW STIFFNESS FLEX CIRCUIT AND ESD PROTECTION

BACKGROUND OF THE INVENTION

1. Field of the Invention

The present invention relates to disk drives and particularly to a flex circuit design for a flex on suspension (FOS) head gimbal assembly (HGA) which achieves reduced pitch and roll stiffness by patterning an insulator substrate of the FOS, and by selectively leaving bare conductive trace sections. The present invention further relates to the protection of magnetoresistive (MR) heads from damage caused by electrostatic discharge (ESD) buildup. More particularly, the invention concerns a method for minimizing cross-talk, noise, and distortion, by depositing a seed layer material on one side of the FOS.

2. Description of Related Art

In a conventional disk drive, a read/write head is secured to a rotary actuator magnet and a voice coil assembly by means of a suspension and an actuator arm, and is positioned over a surface of a data storage disk. In operation, a lift force is generated by the aerodynamic interaction between the head and the disk. The lift force is opposed by a counter-acting spring force applied by the suspension, such that a predetermined flying height is maintained over a full radial stroke of the rotary actuator assembly above the surface of the disk.

The suspension includes a load beam and a flexure secured to a cantilevered end of the load beam. A slider is mounted to the flexure. The flexure provides a proper pivotal connection for the slider so that during operation, the slider can compensate for irregularities in the disk drive manufacture and operation, by pitching and/or rolling slightly in order to maintain the air bearing, while maintaining appropriate stiffness against yaw movement. Roll is defined as the rotation about an axis extending directly out from the actuator arm through the pivot connection point and parallel to the X-Y plane of the disk. Pitch is defined as rotation about an axis perpendicular to the roll axis through the pivot contact point and parallel to the X-Y plane of the disk. Yaw is gyration around an axis perpendicular to the air-bearing surface. The flexure has to achieve low enough pitch and roll stiffness for the air bearing flying height tolerances while at the same time achieving high enough yaw stiffness for track seeking. A dimple extends from either the load beam or the flexure tongue, to provide a point load about which the slider gimbals.

As with wires or other types of electrical interconnects, Flex on suspensions (FOS) tend to increase the static pitch and roll angle variations, the gimbal stiffness and the gimbal stiffness variation of the HGA suspension. This results in increased flying height variability of the suspended slider.

Several head designs have been proposed to minimize the stiffness of the FOS circuit, so that the air bearing can more easily overcome the pitch and roll variations of the head. Other head designs have been proposed to reduce pitch and roll changes due to thermal and humidity induced swelling or shrinkage of the polyimide or insulator layer of the FOS.

The following references illustrate various head designs employing flex circuits or insulating layers and conductive traces:

U.S. Pat. No. 4,645,280 to Gordon et al.;
U.S. Pat. No. 4,761,699 to Ainslie et al.;
U.S. Pat. No. 4,819,094 to Oberg;

U.S. Pat. No. 4,996,623 to Erpelding et al.;
U.S. Pat. No. 5,055,969 to Putnam;
U.S. Pat. No. 5,124,864 to Matsuzaki;
U.S. Pat. No. 5,185,683 to Oberg et al.;
U.S. Pat. No. 5,491,597 to Benin et al.;
U.S. Pat. No. 5,528,819 to McKay et al.;
U.S. Pat. No. 5,597,496 to Massaichi et al.;
U.S. Pat. No. 5,598,307 to Bennin;
U.S. Pat. No. 5,606,477 to Erpelding et al.;
U.S. Pat. No. 5,687,479 to Bennin et al.; and
U.S. Pat. No. 5,734,523 to Scheidecker et al.

U.S. Pat. No. 5,598,307 to Bennin, supra, is an exemplary reference, and describes laminate structures for use in head suspension assemblies. The laminate structures are intended to eliminate manual handling of conductors by integrating the manufacture of the interconnect assembly with that of the suspension assembly. The first step in the manufacture of the laminate structures is to providing a multi-layer laminate sheet. The sheet comprises a first layer of a metal spring material, an intermediate second layer of an electrically insulating, adhesive material, and a third layer of an electrically conductive material. The second step is to create the layers, starting from the outside in.

The first layer is etched to become the primary spring element. The third layer is etched to provide at least one trace, the trace including at least one elongated conductor configured for electrical coupling to a head assembly and for operation as an additional mechanical spring element in selected regions. The second layer provides panels shaped in conformance with the areas of contact between the structure remaining after the etching to produce the elements of the first and the third layers. The traces of the laminate structure are electrically coupled to a head assembly and the laminate structure is attached to other elements of the head stack assembly. The design includes sections wherein the first and second layers are etched away, leaving the traces of the third layer to serve as both the electrical conductors and the gimbal or flexure.

The Laminate structures include interconnect assemblies, interconnect-suspension assemblies, and gimbal-interconnect assemblies. Interconnect assemblies attach to a load beam and include at least one conductive trace. The second layer provides dielectric insulation and the third layer can include support and stiffening plates. An interconnect-suspension assembly embodiment has a first layer of stainless steel, a thin second layer of polyimide, and a third layer of copper solder mask may be deposited over the copper traces. Gold may be deposited on the copper traces where there is no solder mask.

Many modern disk drives employ MR recording heads that provide improved performance in a number of important respects. However, compared to previous generation thin-film recording heads, MR heads are much more susceptible to damage from ESD. ESD can be generated during the drive operation, or during manufacturing operations.

Several head designs have been proposed to reduce static charge buildup, cross-talk, noise, and distortion. The following patents illustrate some of these head designs:

U.S. Pat. No. 5,055,969 to Putnam;
U.S. Pat. No. 5,644,454 to Arya et al.;
U.S. Pat. No. 5,654,850 to Ganapathi et al.; and
U.S. Pat. No. 5,699,212 to Erpelding et al.

U.S. Pat. No. 5,055,969 to Putnam, supra, is an exemplary reference, and describes a flexible circuit for an actuator arm of a hard disk storage device. The flexible circuit has a servo preamplifier, a data preamplifier, a signal routing layer which includes a first ground plane, and an electrically conductive second ground plane which is electrically isolated from and closely spaced to the signal routing layer. The flexible circuit includes a flexible substrate which bends so that the actuator arm remains electrically connected to the servo controller and data read/write circuitry when the actuator arm moves the heads from track to track on the disk surfaces. The flexible substrate is multilayered and is formed of a plurality of electrically insulating and conducting layers. The conducting layers include a signal routing layer with a first ground plane which underlies the data and servo preamplifiers and a second electrically floating ground plane layer.

The signal routing layer contains a plurality of data lines which route data between the data head and the data preamplifier and between the data preamplifier and the tail portion. The conductive servo lines are also routed on the signal routing layer. The conductive servo lines route servo data between the servo head and the servo preamplifier and between the servo preamplifier and the tail portion. A conductive, electrically floating second ground plane is incorporated into a layer beneath the signal routing layer. An electrically insulating layer separates the signal routing layer from the second ground plane.

However, there is still a need for a flex circuit design HGA that achieves reduced pitch and roll stiffness, and that further provides ESD protection, and minimizes cross-talk, noise, and distortion.

SUMMARY OF THE INVENTION

A feature of the present invention is to provide a new flex circuit design for use in a head gimbal assembly, for achieving reduced pitch and roll stiffness by patterning an insulator substrate of the FOS, and by selectively leaving bare conductive trace sections.

Another feature of the present invention is to minimize the head pitch and roll changes resulting from thermal and humidity induced swelling or shrinkage.

A further feature of the present invention is to provide protection of magnetoresistive (MR) heads from damage caused by electrostatic discharge (ESD) buildup. Further, the invention minimizes cross-talk, noise, and distortion, by depositing a seed layer material on one side of the flex circuit.

The foregoing and other features and advantages of the present invention can be achieved by a new head gimbal assembly design. The head gimbal assembly includes a suspension of the type supporting a slider and a flex circuit. The suspension is formed of a load beam that supports the flex circuit, and a resilient flexure which is secured to the load beam and which supports the slider. The flex circuit is comprised of conductive traces formed on a compliant, dielectric substrate. The substrate includes a body portion and a head portion for supporting the conductive traces. The substrate head portion is patterned such that selected portions of the head portion are removed to leave bare conductive trace sections, and to achieve reduced pitch and roll stiffness of the combined flexure and flex circuit. The flex circuit can optionally include a thin seed layer formed on the underside of the substrate to reduce electrostatic charge buildup.

BRIEF DESCRIPTION OF THE DRAWINGS

The features of the present invention and the manner of attaining them, will become apparent, and the invention itself will be understood by reference to the following description and the accompanying drawings, wherein.

Similar numerals in the drawings refer to similar or identical elements. It should be understood that the sizes of the different components in the figures might not be in exact proportion, and are shown for visual clarity and for the purpose of explanation.

DETAILED DESCRIPTION OF THE PREFERRED EMBODIMENTS

Figure 1:
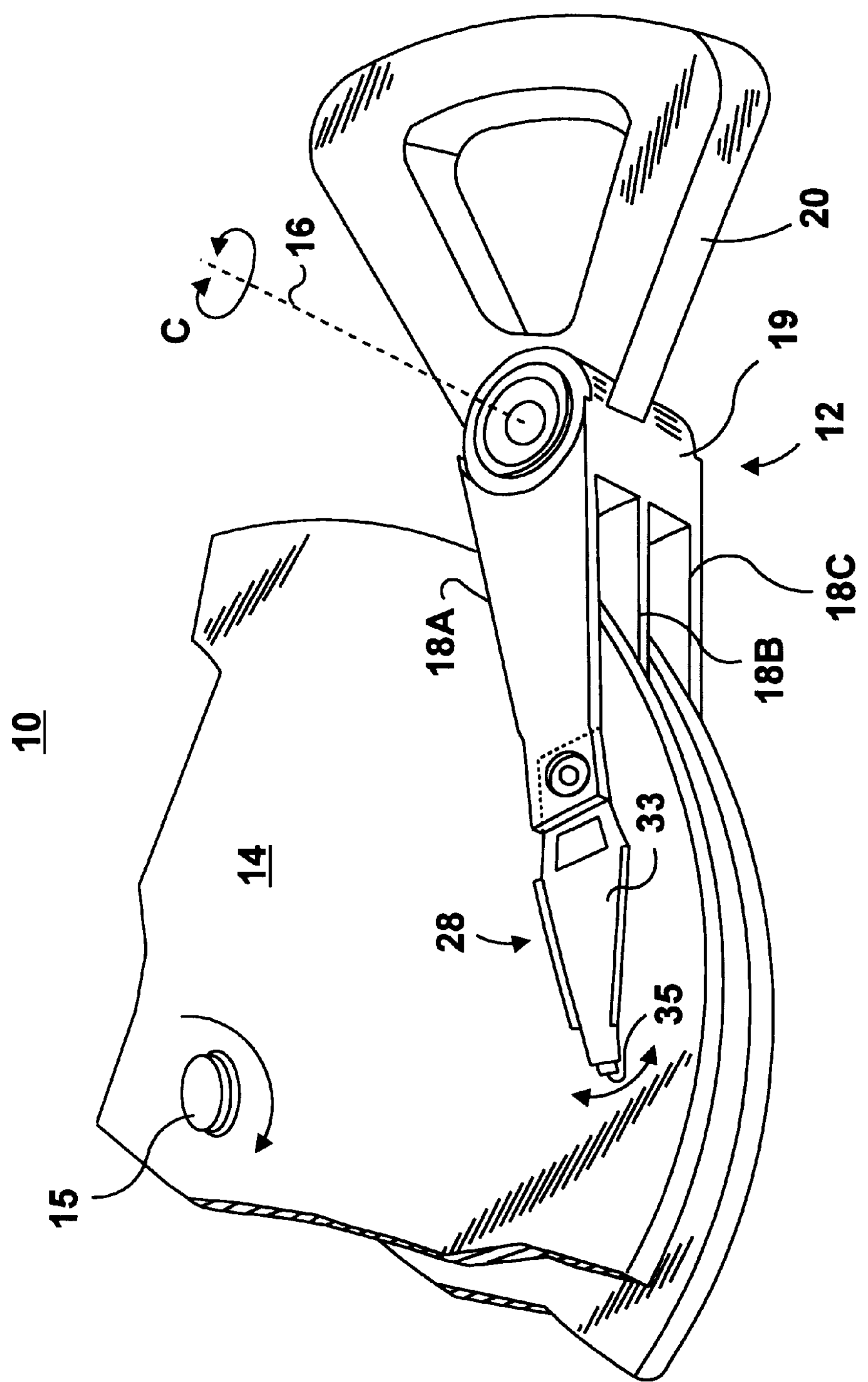
FIG. 1 is a fragmentary isometric view of a data storage system utilizing a head gimbal assembly (HGA) according to the present invention.

FIG. 1 illustrates a disk drive 10 comprised of a head stack assembly 12 and a stack of spaced apart magnetic data storage disks or media 14 that are rotatable about a common shaft 15. The head stack assembly 12 is rotatable about an actuator axis 16 in the direction of the arrow C. The head stack assembly 12 includes a number of actuator arms, only three of which 18A, 18B, 18C are illustrated, which extend into spacings above and below the disks 14.

The head stack assembly 12 further includes an E-shaped block 19 and a magnetic voice coil (or rotor) 20 attached to the block 19 in a position diametrically opposite to the actuator arms 18A, 18B, 18C. A voice coil 20 cooperates with a stator (not shown) for rotating in an arc about the actuator axis 16. Energizing the voice coil 20 with a direct current in one polarity or the reverse polarity causes the head stack assembly 12, including the actuator arms 18A, 18B, 18C, to rotate about the actuator axis 16, in a direction substantially radial to the disks 14.

Figure 2:
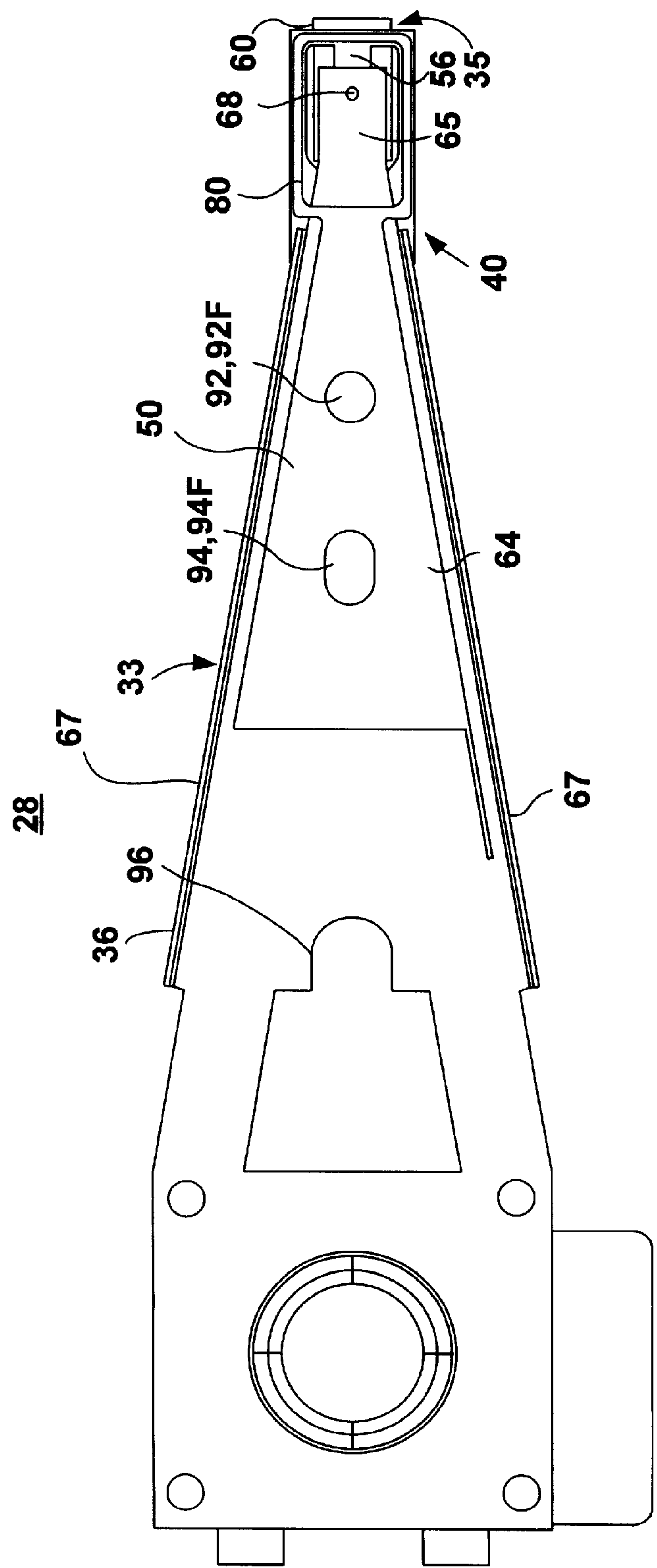
FIG. 2 is a top plan view of the HGA comprised of a load beam, a flexure, a flex on suspension (FOS), and a slider, and forming part of the data storage system of FIG. 1.
Figure 3:
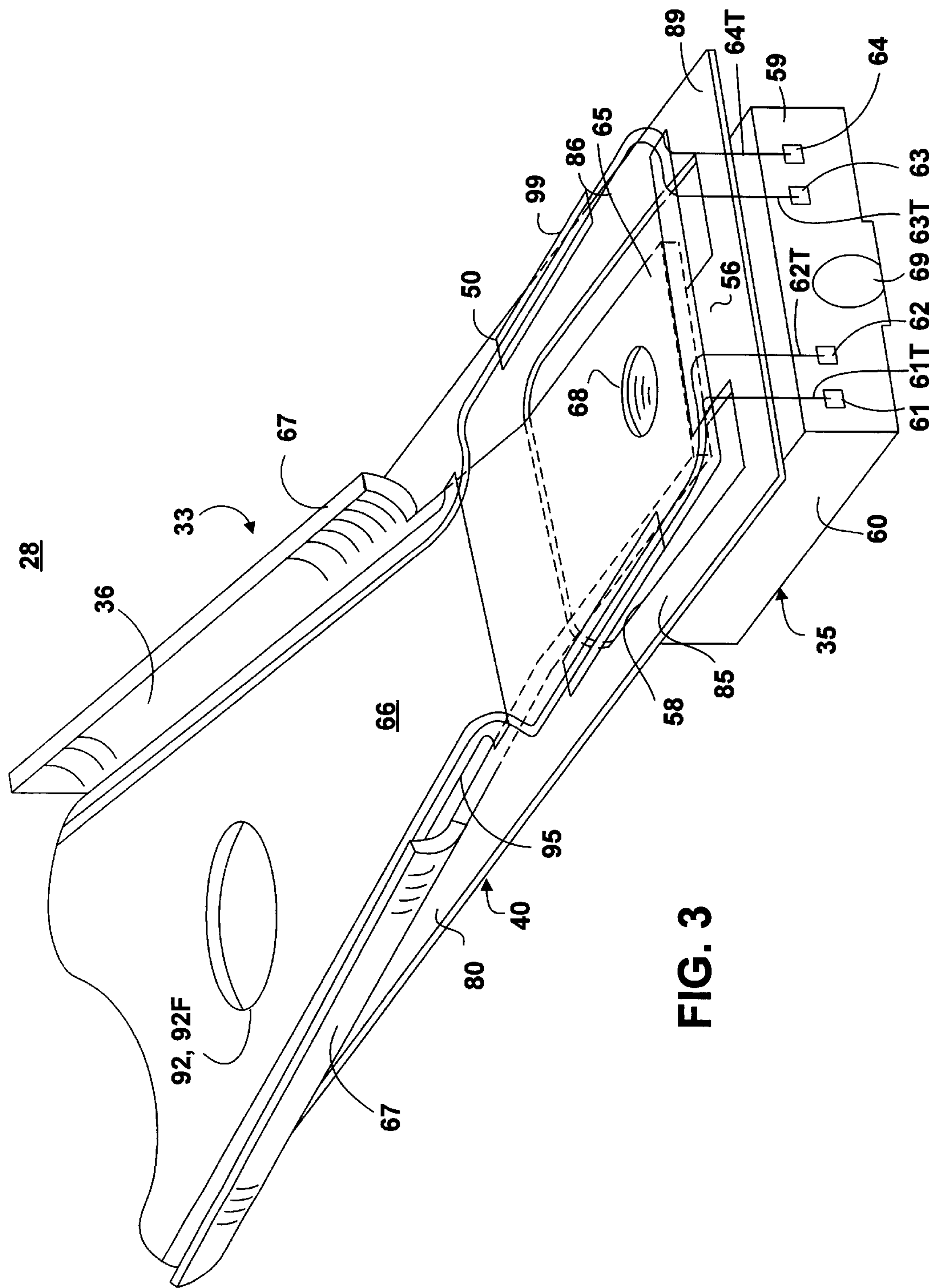
FIG. 3 is an enlarged isometric view of the HGA of FIG. 2, illustrating a schematic view of the FOS relative to load beam, the flexure, and the slider.

A head gimbal assembly (HGA) 28 is secured to each of the outer actuator arms, for instance 18A and 18C. A pair of HGA's 28 is secured to each inner actuator arm, for instance 18B. With further reference to FIGS. 2 and 3, the HGA 28 is comprised of a suspension (or suspension assembly) 33 and a read/write head 35. The suspension 33 includes a load beam 36 and a flexure 40 to which the head 35 is secured. The HGA 28 further includes a flex circuit or a flex circuit on suspension (FOS) 50, which is illustrated in greater detail in FIGS. 5 and 5A.

Figure 6:
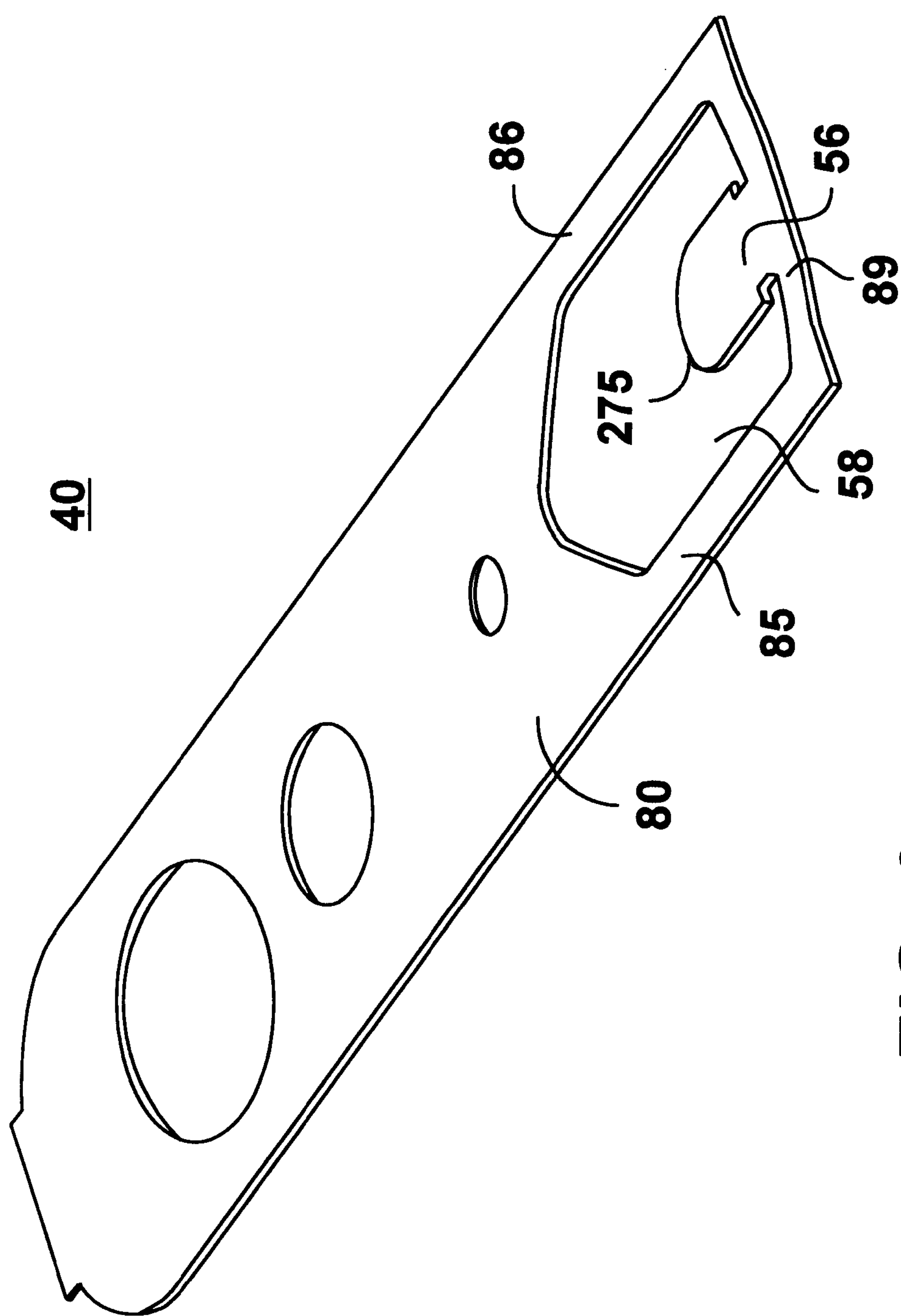
FIG. 6 is an isometric view of a flexure forming part of the HGA of FIGS. 2 and 3.

With reference to FIGS. 3 and 6, the flexure 40 includes a tongue 56 that extends inwardly, within a clearance 58. The clearance 58 is contoured by a flexure body 80, two oppositely disposed peripheral ribs or outriggers 85, 86, and a trailing edge 89. The flexure 40 provides a slider 60 with sufficient flexibility in various degrees of movement for accommodating the uneven topology of the disk surface and other components and drive assembly tolerances, while the slider 60 is flying over the disk 14. The flexure 40 is sufficiently stiff in a plane parallel to the disk plane, to resist physical deflection that may be caused by the rapid movement of the actuator arms 18A, 18B, 18C.

Figure 8:
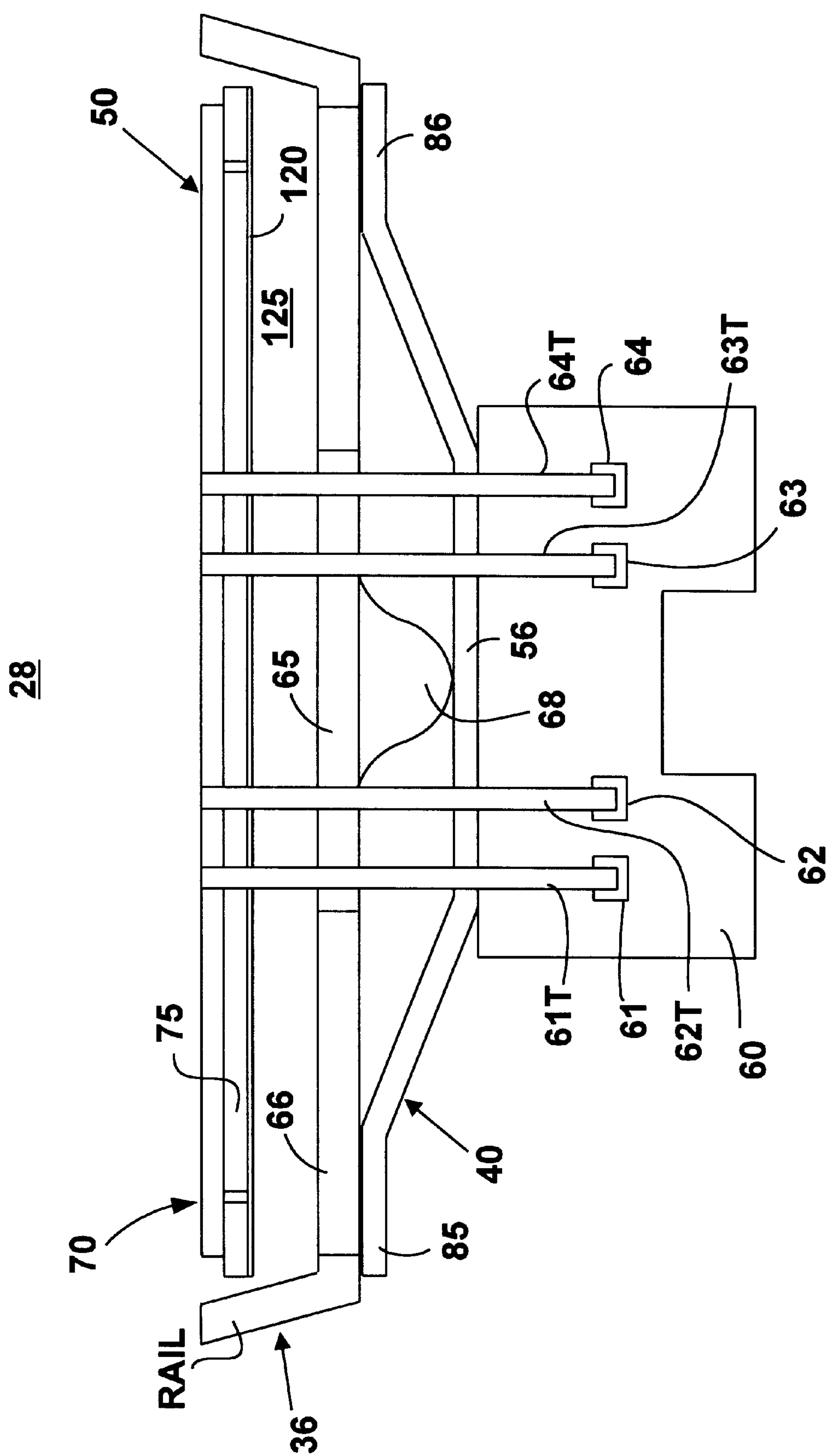
FIG. 8 is a front elevational view of the HGA of FIG. 7.

The slider 60 is part of the read-write head 35, and is secured to the tongue 56 by means of available techniques such as UV curable epoxy. The trailing side 59 of the slider 60 includes a plurality of conductive contact pads, four of which 61, 62, 63, 64 are shown in FIGS. 3 and 8 for the purpose of illustration only. These contact pads 61–64 are electrically connected to the FOS 50 by means of corresponding conductive traces 61T, 62T, 63, 64T, for connection to a read-element 69.

Figure 7:
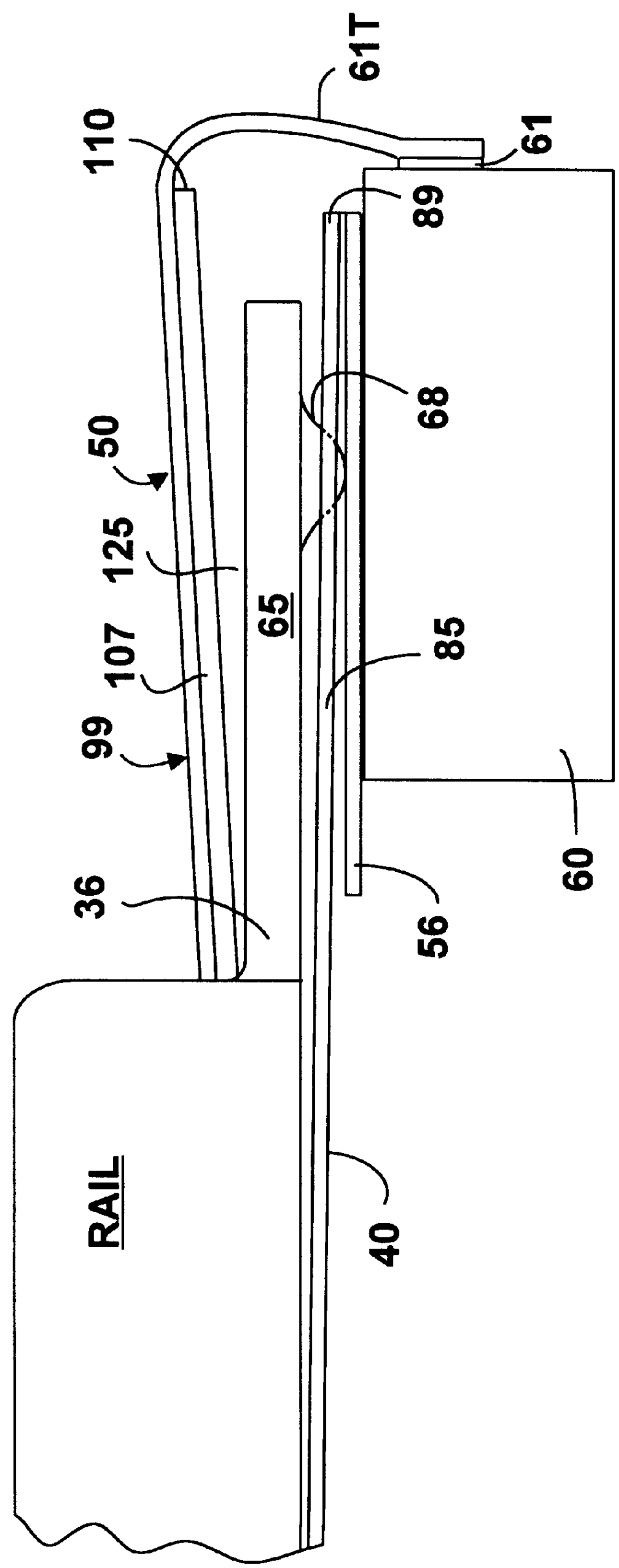
FIG. 7 is an enlarged, fragmentary, side elevational view of the HGA of FIGS. 2 and 3.

With further reference to FIGS. 7 and 8, a dimple 68 is formed in the load beam 36, and is urged against the backside of the tongue 56, for contributing to the gimbaling action. Alternatively, the dimple 68 may be formed on the tongue 56, and urged against the underside of the load beam 36.

Figure 4:
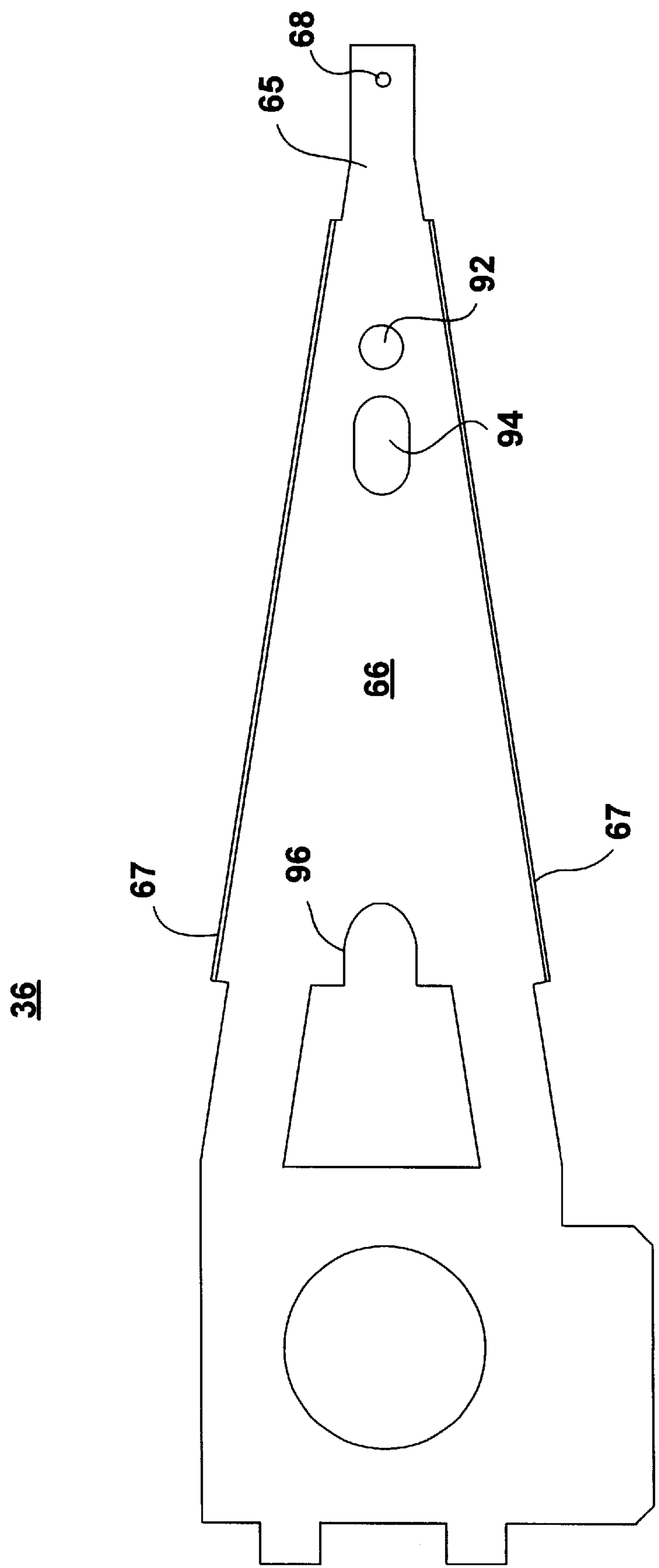
FIG. 4 is a top plan view of the load beam of FIGS. 2 and 3.

With reference to FIGS. 3, 4, 7, and 8, the load beam 36 includes a tip 65 which is positioned in proximity to peripheral ribs 85, 86 of the flexure 40, and above the flexure clearance 58 and at least part of the tongue 56. The tip 65 extends integrally in a body 66 having two stiffening rails 67 projecting along the length of the body 66. The body 66 includes datum features 92, 94, and 96, and the tip 65 includes the dimple 68 (FIG. 4).

Figure 5:
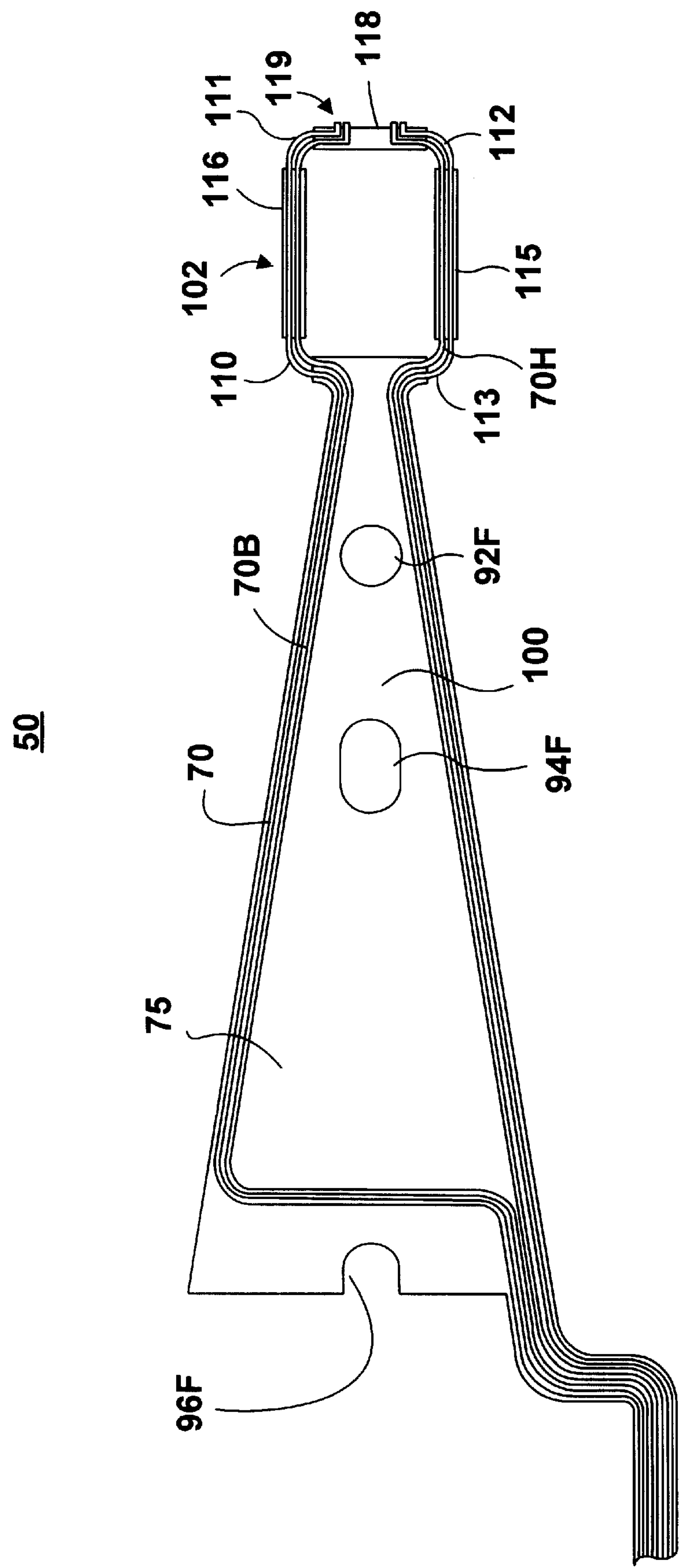
FIG. 5 is a top plan view of the FOS of FIGS. 2 and 3.
Figure 5A:
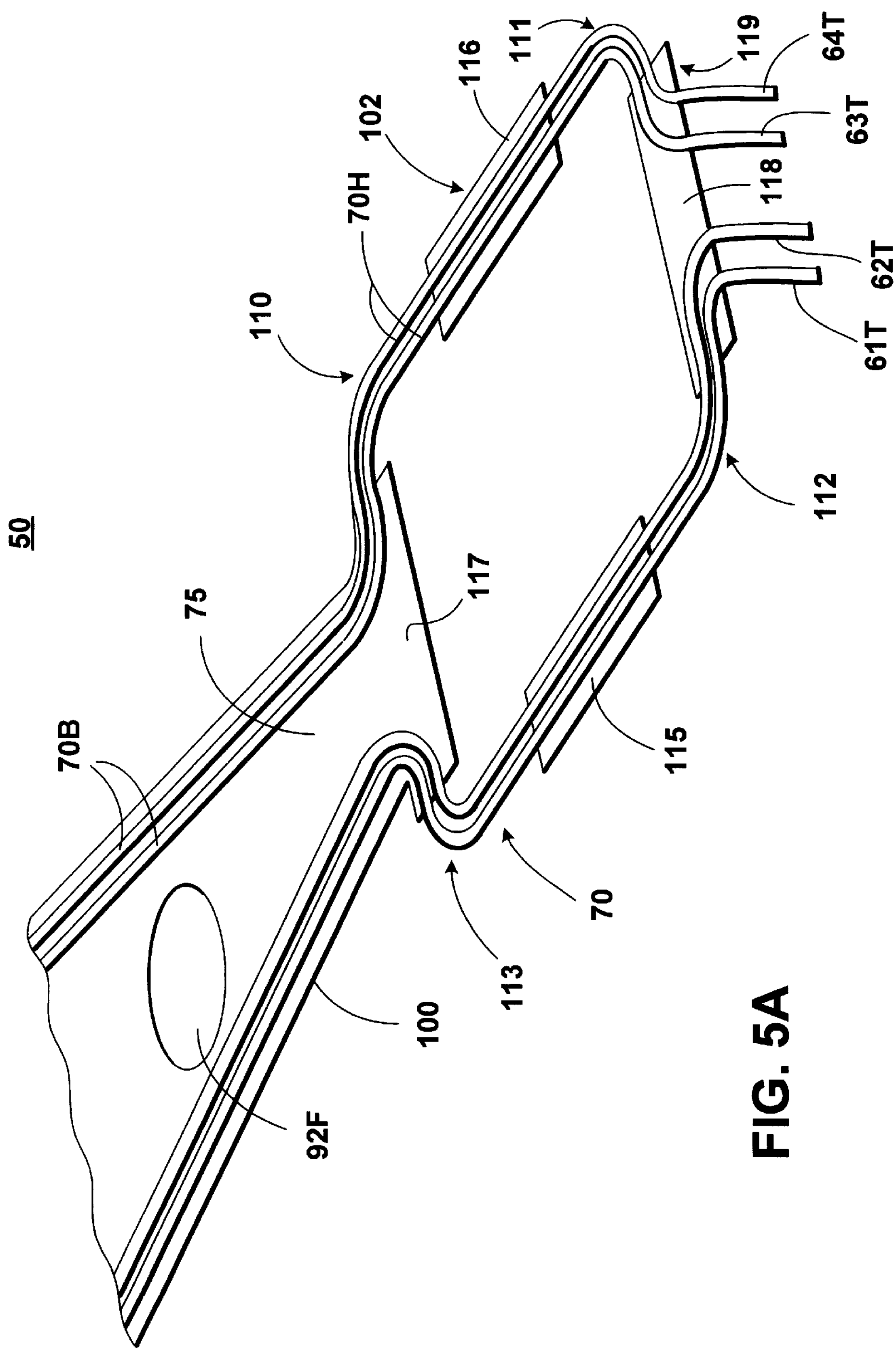
FIG. 5A is an enlarged, isometric, fragmentary view of the FOS of FIG. 5.

Referring to the drawings and more particularly to FIGS. 3, 5, and 5A, the FOS 50 is formed, for example, of a laminate comprised of conductive traces 70 that are formed on a patterned, compliant, substrate 75. The conductive traces 70 can be made primarily of conductive material, such as aluminum, steel, beryllium, gold, silver, but preferably from copper, due to the desirable conductivity and processing advantage of copper. The conductive traces 70, or selected portions thereof, can optionally be coated with a protective layer (not shown) to prevent them from shorting or corroding.

The substrate 75 is a flat, patterned, flexible sheet of material adhered on one side to the conductive traces 70 by means of available techniques. The substrate 75 is made of plastic or polymeric resinous material, such as polyimide, and is attached to the conductive traces 70. The substrate 75 includes a body portion 100 and a patterned head portion 102.

The substrate body portion 100 overlays the load beam body 66, and is secured thereto at selected locations by means of available techniques such as adhesive bonding. The substrate body portion 100 includes three datum holes or clearances 92F, 94F, and 96F that coincide with the load beam datum features 92, 94, and 96 respectively. The datum holes 92F, 94F, and 96F can be used for mechanical registration, or can be enlarged for clearance of suspension registration pins, if other means of location, for example optical registration, are used. The substrate head portion 102 overlays, but does not touch the flexure peripheral ribs 85, 86 and trailing edge 89, as is illustrated in FIG. 7.

An important aspect of the present invention is the patterning of the substrate 75. Selected portions of the substrate 75 are removed, such as by etching, leaving bare conductive trace sections. For example, and as is illustrated in FIGS. 5 and 5A, the substrate 75 is etched away at four corner locations 110, 111, 112, 113, leaving two side pads 115, 116, a leading pad 117, and one trailing pad 118 to support the conductive traces 70H of the head portion 102.

The conductive traces 70 are comprised of body traces 70B and head traces 70H. The body traces 70B are formed on the substrate body portion 100, and the head traces 70H are formed on the patterned substrate head portion 102. While in this particular example the conductive traces 70 include four traces 61T, 62T, 63T, 64T, it should be clear that a different number of traces can alternatively be selected to form the conductive traces 70.

The side pads 115, 116 can be positioned along the middle section of the outriggers, between adjacent corners (or bend regions), such as corners 112, 113, and 110, 111, respectively. The trailing pad 118 can be positioned along the middle section of the trailing edge 119 between corner locations 111, 112. The side pads 112, 113 and the trailing pad 118 support conductive head traces 70H. While this particular embodiment utilizes two side pads 115, 116 and one trailing pad 118, it should be clear that a different number of intermittent or separate dielectric pads can be left to avoid shorting and to support the conductive traces 70.

In this illustration, the patterning of the substrate 75 leaves conductive bare traces at the corner locations 110, 111, 112, 113. The removal of the dielectric substrate at the corner locations 110, 111, 112, 113, reduces the pitch and roll stiffness of the FOS 50 in these locations.

In addition, the patterning of the substrate 75 minimizes the head pitch and roll changes resulting from thermal and humidity induced swelling or shrinkage, since the traces have lower thermal coefficients of expansion than the substrate 75 as well as lower moisture absorption than the substrate 75. The embodiment illustrated herein is only an example of leaving bare traces to reduce stiffness. Many other patterns can be used to reduce stiffness while providing adequate prevention from shorting and lending good manufacturing yields.

With reference to FIG. 8, a thin seed layer 120 of Ni, Cr, or another seed layer material can be sputter deposited on the backside of the substrate 75 to reduce static charge buildup. The seed layer 120 can be, for example, 150 Angstrom thick. According to another embodiment, seed layer material is deposited on both sides of the substrate 75 to facilitate copper plating and formation of the conductive traces 70. Once this step is completed, the seed layer 120 is left on the backside of the substrate 75.

Figure 9:
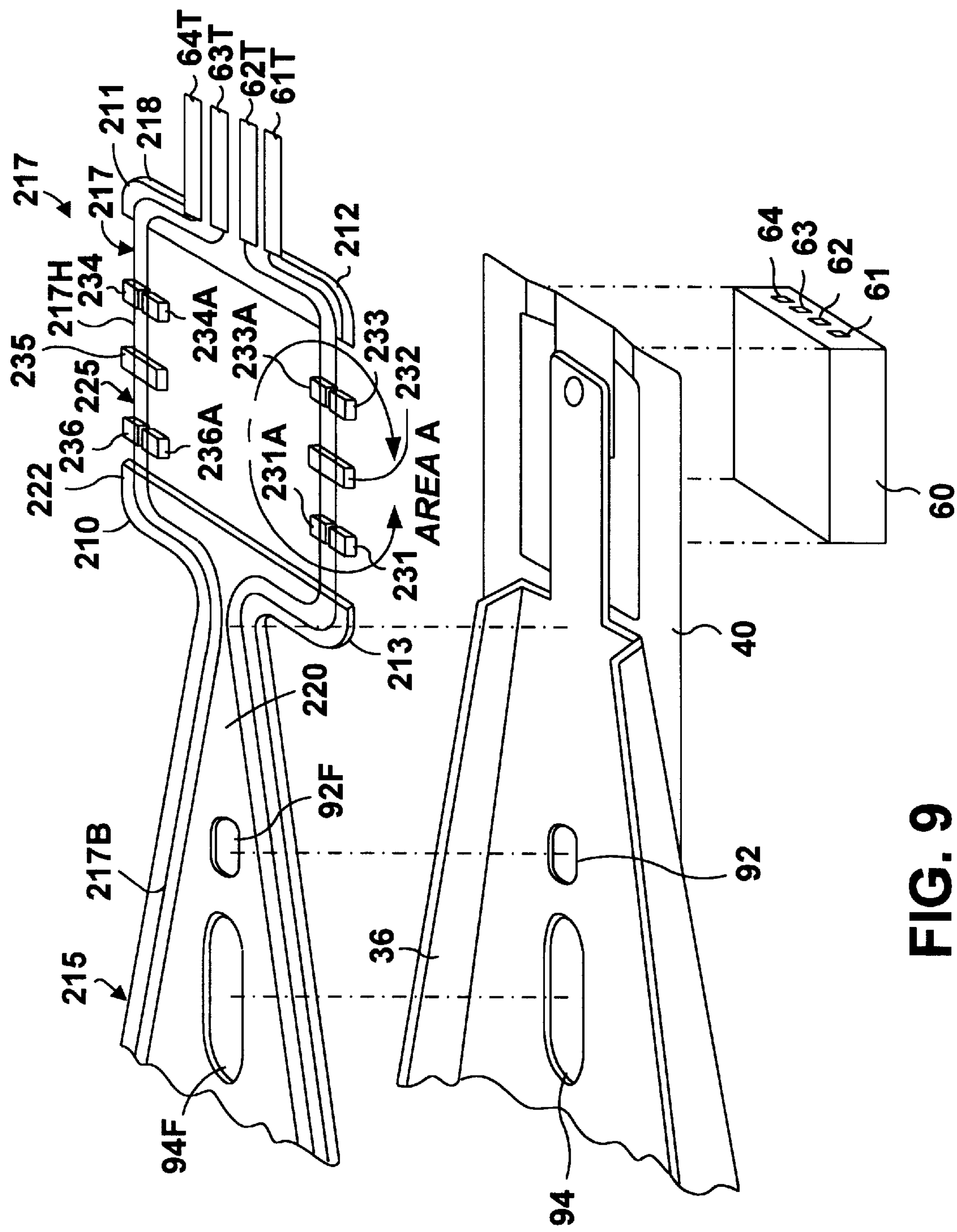
FIG. 9 is an exploded, fragmentary, schematic, isometric view of another HGA comprising a new FOS design according to the present invention.
Figure 10:
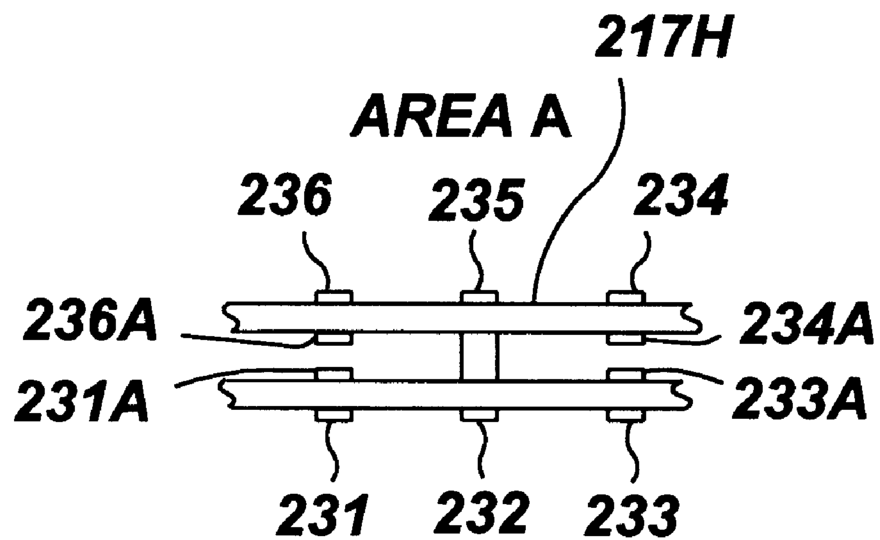
FIG. 10 is an enlarged, top view of a section of the FOS of FIG. 9, designated as Area A.
Figure 11:
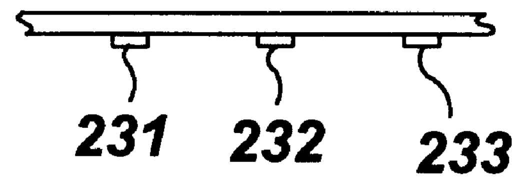
FIG. 11 is an enlarged, side elevational view of Area A.

FIGS. 9 through 11 illustrate another FOS 200 according to the present invention. As explained above in connection with FOS 50, FOS 200 generally includes a substrate 215 on which conductive traces 217 are formed. The substrate 215 is patterned differently from substrate 75 (FIG. 5A), to illustrate a few exemplary patterning variations of the substrate 215.

The substrate body portion 215 overlays a load beam body 220, which is generally similar to the substrate body portion 100 (FIG. 5A), and which extends in a patterned head portion 222. The substrate body portion 220 overlays the load beam body 66, and is secured thereto at selected locations. The substrate body portion 220 includes three datum holes or clearances 92F, 94F, and 96F that coincide with the load beam datum features 92, 94, and 96 respectively. The datum holes 92F, 94F, and 96F can be used for mechanical registration, or can be enlarged for clearance of suspension registration pins, if other means of location, for example optical registration, are used. The substrate head portion 222 overlays, but does not touch the flexure 40.

The conductive traces 217 are composed of body traces 217B and head traces 217H. The body traces 217B are formed on the substrate body portion 220, and the head traces 217H are formed on the patterned substrate head portion 220.

In this embodiment, the substrate 215 is not etched at the corner locations 210, 211, 212, 213. Rather, the substrate head portion 222 is etched in a predetermined pattern, along the sides or outriggers 225, 226 to form a plurality of side support pads, for example pads 231, 231A, 232, 233, 233A, 234, 234A, 235, 236, and 236A, that prevent the conductive head traces 217H from shorting to the flexure 40, while allowing them to bend, and to expand or contract thermally, with minimal effect on the stiffness of the head 35.

In this example, the patterned substrate head portion 222 can include at least two types of support pads: a short type and a long type. Each of the short pads, such as 231, 231A, 233, 233A, 234, 234A, 235, 235A, supports a single body trace 217B. Each of the long pads, such as 232, 235, supports two (or more) adjacent body traces 217B.

The support pads 231, 231A, 232, 233, 233A, 234, 234A, 235, 236, and 236A, are disposed intermittently along the outriggers 225, 226, between adjacent corner locations 210, 111, and 212, 213. Atrailing pad 218 is positioned along the middle section of the trailing edge, and extends between corner locations 211, 212, to support the conductive head traces 217H along this trailing edge. While this particular embodiment utilizes five side support pads 231, 231A, 232, 233, 233A, or 234, 234A, 235, 236, 236A along each outrigger 225, 226, and one trailing support pad 218 along the trailing edge, it should be clear that a different pattern and/or number of support pads can alternatively be used in conformity with the present invention.

Figure 12:
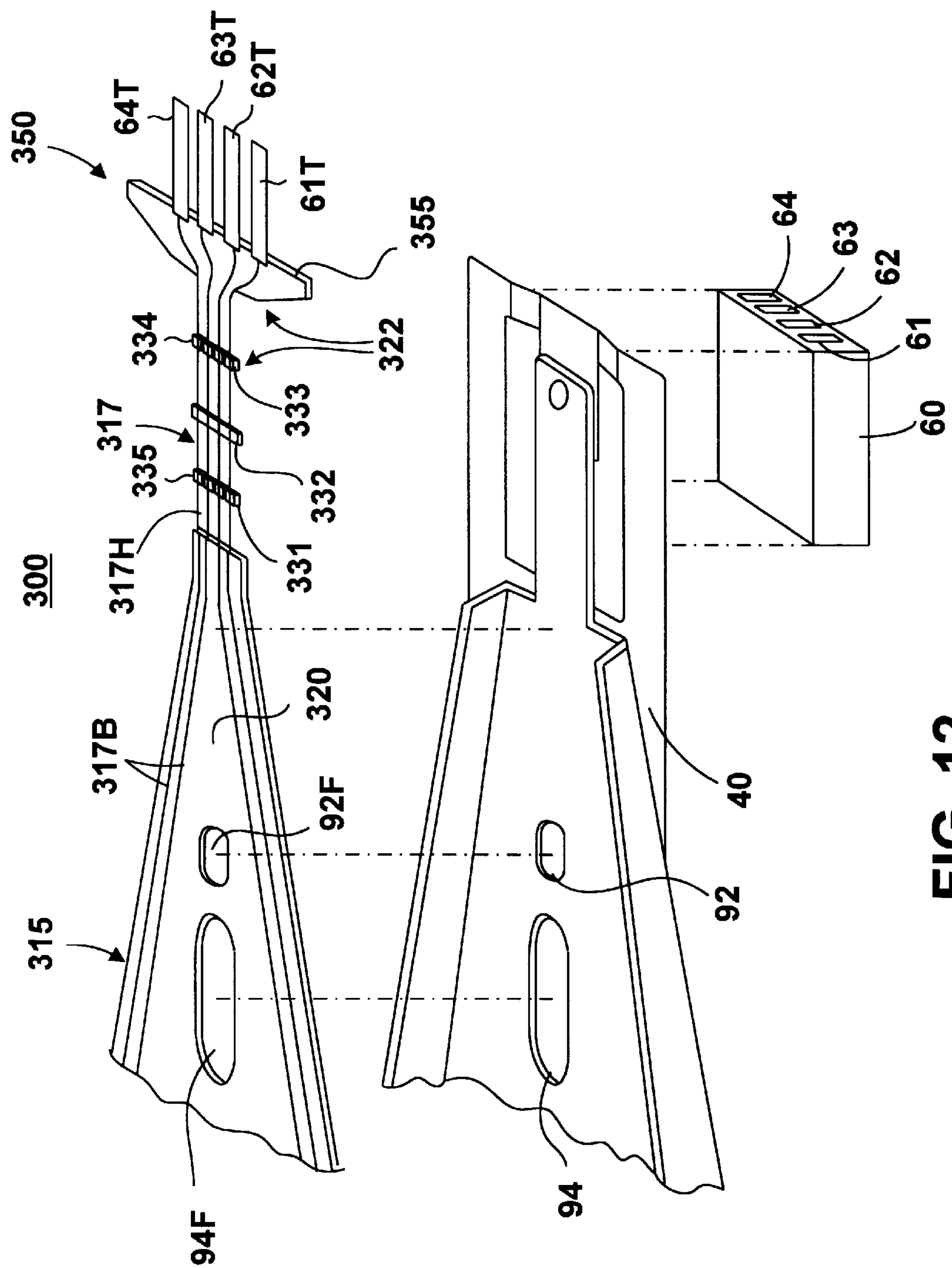
FIG. 12 is an exploded, fragmentary, schematic, isometric view of yet another HGA comprising a new FOS design according to the present invention.

FIG. 12 illustrates yet another FOS 300 according to the present invention. As explained above in connection with FOS 50 and 200, FOS 300 generally includes a substrate 315 on which conductive traces 317 are formed. The substrate 315 is patterned differently from substrate 75 (FIG. 5A) and substrate 215 (FIG. 9).

The substrate body portion 315 overlays a load beam body 320, which is generally similar to the substrate body portion 220 of FIG. 9, and which extends in a patterned head portion 322. The substrate body portion 320 overlays the load beam body 66, and is secured thereto at selected locations. The substrate body portion 320 includes three datum holes or clearances 92F, 94F, and 96F that coincide with the load beam datum features 92, 94, and 96 respectively. The datum holes 92F, 94F, and 96F can be used for mechanical registration, or can be enlarged for clearance of suspension registration pins, if other means of location, for example optical registration, are used. The substrate head portion 322 overlays, but does not touch the flexure 40.

The conductive traces 317 are composed of body traces 317B and head traces 317H. The body traces 317B are formed on the substrate body portion 320, and the head traces 317H are formed on the patterned substrate head portion 322.

In this embodiment, the head traces 317H extend in a parallel manner and then divert into four traces 61T, 62T, 63T, 64T at the trailing edge 350. The substrate head portion 322 is etched in a predetermined pattern, to support the head traces 317H. For example, the substrate head portion 320 is formed of a plurality of support pads such as support pads 331, 332, 333, 334, and 335, that support the conductive head traces 317H, while allowing them to bend, and thermally expand or contract, with minimal effect on the stiffness of the head 35.

In this example, the patterned substrate head portion 322 can include at least two types of support pads: a short type and a long type, as explained above in relation to FIG. 9. The support pads 331, 332, 333, 334, and 335 are disposed intermittently, between a trailing support pad 355 and the substrate body portion 320. The trailing support pad 355 supports the conductive head traces 317H along the trailing edge 350. While this particular embodiment utilizes five support pads 331, 332, 333, 334, and 335, and one trailing support pad 355, it should be clear that a different pattern and/or number of support pads can alternatively be used in conformity with the present invention.

While the embodiments described herein illustrate the substrate head portion 322 as being patterned, it should be clear that the substrate body portion 320 can similarly be etched, either by itself, or in combination with the substrate head portion 322, in a desired pattern, to further assist in minimizing the stiffness of the FOS 50, 200, or 300.

It should be understood that the geometry, compositions, and dimensions of the elements described herein may be modified within the scope of the invention and are not intended to be the exclusive; rather, they can be modified within the scope of the invention. Other modifications may be made when implementing the invention for a particular environment.

What is claimed is:

1. A head gimbal assembly of the type supporting a slider and a flex circuit, comprising:

a load beam for supporting the flex circuit;

a flexure secured to said load beam and supporting the slider;

the flex circuit comprised of conductive traces formed on a compliant, dielectric substrate;

said substrate including a body portion and a head portion for supporting said conductive traces; said substrate head portion being patterned such that selected portions of said head portion are removed to leave bare conductive trace sections, and to achieve reduced pitch and roll stiffness of said flexure and the flex circuit contributed by the flex circuit;

wherein said flexure includes two peripheral ribs and a trailing edge; and wherein in a resting position said substrate head portion overlays, without touching, said flexure peripheral ribs and said trailing edge.

2. A head gimbal assembly according to claim 1, wherein said conductive traces include a bend region; and wherein said substrate head portion is patterned to remove substrate material from underneath said bend region.

3. A head gimbal assembly according to claim 2, wherein said conductive traces include four bend regions; and wherein said substrate head portion is patterned to remove substrate material from underneath a conductive trace of at least one of said bend regions.

4. A head gimbal assembly according to claim 1, wherein said conductive traces are made of any of or more of: aluminum, steel, beryllium, gold, silver, or copper.

5. A head gimbal assembly according to claim 1, wherein said substrate is made of any of: plastic or polymeric resinous material.

6. A head gimbal assembly according to claim 5, wherein said substrate is made of polyimide.

7. A head gimbal assembly according to claim 1, wherein said substrate body portion overlays a part of said load beam, and is secured thereto at selected locations; and said substrate body portion includes a datum feature that coincides with a load beam datum hole.

8. A head gimbal assembly according to claim 1, wherein said conductive traces include body traces and head traces; and wherein said substrate includes a plurality of pads that separate said head traces from shorting to said flexure.

9. A head gimbal assembly according to claim 8, wherein said plurality of pads include at least one side pad and one trailing pad.

10. A head gimbal assembly according to claim 1, further including a seed layer formed on said substrate to reduce static charge buildup.

11. A suspension assembly of the type supporting a slider, comprising:

a flex circuit;

a load beam for supporting said flex circuit;

a resilient flexure secured to said load beam and supporting the slider;

said flex circuit comprised of conductive traces formed on a compliant, dielectric substrate;

said substrate including a body portion and a head portion for insulating and supporting said conductive traces;

said substrate head portion being patterned such that selected portions of said head portion are removed to leave bare conductive trace sections, and to achieve reduced pitch and roll stiffness of said flexure and the flex circuit contributed by the flex circuit;

wherein said flexure includes two peripheral ribs and a trailing edge; and wherein in a resting position said substrate head portion overlays, without touching, said flexure peripheral ribs and trailing edge.

12. A suspension assembly according to claim 11, wherein said conductive traces include at least one bend region; and wherein said substrate head portion is patterned to remove substrate material from underneath a conductive trace of at least one of said bend regions.

13. A suspension assembly according to claim 11, wherein said substrate body portion overlays a part of said load beam, and is secured thereto at selected locations; and said substrate body portion includes a datum feature that coincides with a load beam datum hole.

14. A suspension assembly according to claim 11, wherein said conductive traces include body traces and head traces; and wherein said flexure includes a body portion, said flexure body portion includes a plurality of separate pads that attach to said conductive head traces.

15. A suspension assembly according to claim 14, wherein said plurality of pads include at least one side pad and one trailing pad.

16. A suspension assembly according to claim 14, further including seed layer formed on said substrate to reduce static charge buildup.

17. A suspension assembly, comprising:

a load beam;

a flexure secured to said load beam;

a flex circuit comprised of conductive traces formed on a compliant dielectric substrate;

said substrate including a body portion and a head portion for supporting said conductive traces; and said substrate head portion being patterned such that selected portions of said head portion are removed to leave bare conductive trace sections, and to achieve reduced pitch and roll stiffness of said flexure and the flex circuit contributed by the flex circuit;

wherein said flexure includes two peripheral ribs and a trailing edge; and wherein in a resting position said substrate head portion overlays, without touching, said flexure peripheral ribs and trailing edge.

18. A suspension assembly according to claim 17, wherein said conductive traces include at least one bend region;

wherein said substrate head portion is patterned to remove substrate material from underneath a conductive trace of said at least one bend region;

wherein said substrate body portion overlays a part of said load beam, and is secured thereto at selected locations;

wherein said conductive traces include body traces and head traces; and wherein said substrate includes a plurality of pads that separate said head traces from shorting to said flexure.

* * * * *